United States Patent
Hsieh et al.

(10) Patent No.: US 6,234,316 B1
(45) Date of Patent: May 22, 2001

(54) WAFER PROTECTIVE CONTAINER

(75) Inventors: H. C. Hsieh, Pingtung Hsien; Jason Horng, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/473,177

(22) Filed: Dec. 28, 1999

(51) Int. Cl.$^7$ .............................. B65D 85/30; B65D 85/02
(52) U.S. Cl. ......................... 206/710; 206/303; 206/724
(58) Field of Search ................................... 206/303, 710, 206/724, 334; 220/324

(56) References Cited

U.S. PATENT DOCUMENTS

| | | | |
|---|---|---|---|
| 4,564,880 | * | 1/1986 | Christ et al. .................. 206/724 X |
| 4,886,162 | * | 12/1989 | Aubrogio .................. 206/724 |
| 5,211,717 | * | 5/1993 | Skoura .................. 206/303 X |
| 5,454,468 | * | 10/1995 | Chou et al. .................. 206/303 |
| 5,553,711 | * | 9/1996 | Lin et al. .................. 206/710 |
| 5,725,100 | * | 3/1998 | Yamada .................. 206/710 |

* cited by examiner

*Primary Examiner*—Bryon P. Gehman
(74) *Attorney, Agent, or Firm*—Charles C. H. Wu; Charles C. H. Wu & Associates, APC

(57) ABSTRACT

The invention describes a wafer protective container for holding integrated circuit (IC) wafers. The wafer protective container comprises a container body, a locking device, a container cover, and a plurality of fasteners assembled together to prevent movement of the IC wafers during transportation. The container body has at least an opening to allow easy loading and unloading of the IC wafers, while the locking device is used to keep the IC wafers in position in the container body. The container cover, which covers the container body, provides more protection for the IC wafers. The container cover has a plurality of notches to enhance ease of opening the IC wafer protective container. Since the fasteners can secure the container cover to the container body, a seal between the container cover and the container body is not broken as a result of rigorous movement during transportation, thus reducing the risk of contaminating the IC wafers.

15 Claims, 4 Drawing Sheets

WAFER PROTECTIVE CONTAINER

BACKGROUND OF THE INVENTION

1. Field of Invention

The present invention relates to a wafer protective container. More particularly, the present invention relates to an integrated circuit (IC) wafer protective container that allows secure storage and easy loading and unloading of IC wafers contained therein to prevent contamination and damage of the IC wafers.

2. Description of Related Art

Conventionally, IC wafers are stored in a cylindrical storage box consisting of a lid and a body. Because the IC wafers are thin and fragile, layers of sponge are usually inserted between the IC wafers to prevent rigorous movement of the IC wafers inside the storage box. The storage box for holding the IC wafers is typically made with a box opening designed to just match the size of the IC wafer, so it is very difficult to load and unload the IC wafers. After the storage box is filled with a desired amount of the IC wafers, the lid is pushed into the body to close the box. Since the storage box is merely closed with a lid, a seal between the lid and the body may be broken by rigorous movement during transportation. As a result, the IC wafers contained within the storage box are contaminated by the surroundings. This problem is traditionally overcome by sealing the storage box with numerous layers of masking tape, which cover a junction between the lid and the body member. However, this increases the cost for packaging the IC wafer products and also makes the whole process more complicated.

Additionally, it is known from the prior art that the box has to be inverted in order to remove the IC wafers from the box, and unloading the IC wafers in this manner can damage the IC wafers, thus causing more IC wafer loss.

SUMMARY OF THE INVENTION

A wafer protective container that provides a secure storage and easy loading and unloading of the IC wafers contained therein is developed to overcome the above-mentioned problems.

As embodied and broadly described herein, the invention provides a wafer protective container which comprises a container body, a locking device, a container cover, and a plurality of fasteners assembled together to protect the IC wafers contained therein from contamination and rigorous movement during transportation.

The container body comprises a flat, circular base on which a desired number of IC wafers is carried, and a hollow cylinder mounted on the base. The hollow cylinder is made of a rim with at least one integral wall segment formed on and above the rim. At least one opening exists in the wall segment to allow easy loading and unloading of a desired amount of the IC wafers. The vertical edges of the opening have indentations therein, whose utility will be described below in context of a locking device. The container body also has, below the circular base, a circular ring with a plurality of hook members on which the fastening members can be mounted. The locking device comprises a circular protrusion and an annular band, wherein the circular protrusion has a plurality of projections sticking out from its edge, and the projections can engage with the indentations in the opening in the container body in order to keep the IC wafers in position. This prevents any rigorous movement of the IC wafers during transportation, thus reducing the risk of damaging the IC wafers. The container cover comprises a circular protuberance with a plurality of notches, which allows easy opening of the IC wafer protective container, and a hollow cylindrical body having a plurality of troughs in its outer surface. The container cover covers the container body so as to provide more protection for the IC wafers. The fasteners comprise a plurality of connecting feet, a plurality of connecting bars, a plurality of connecting necks, and a semi-circular loop. The fasteners are mounted on the hook members with the connecting bars aligned in the troughs, so that the connecting necks can lock onto the top edge of the cylindrical body, while the semi-circular loop can rest on the notch. This completes the assemblage of the IC wafer protective container.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The embodiment of a wafer protective container according to the present invention is illustrated with reference to FIG. 1 through FIG. 6.

Figure 1:
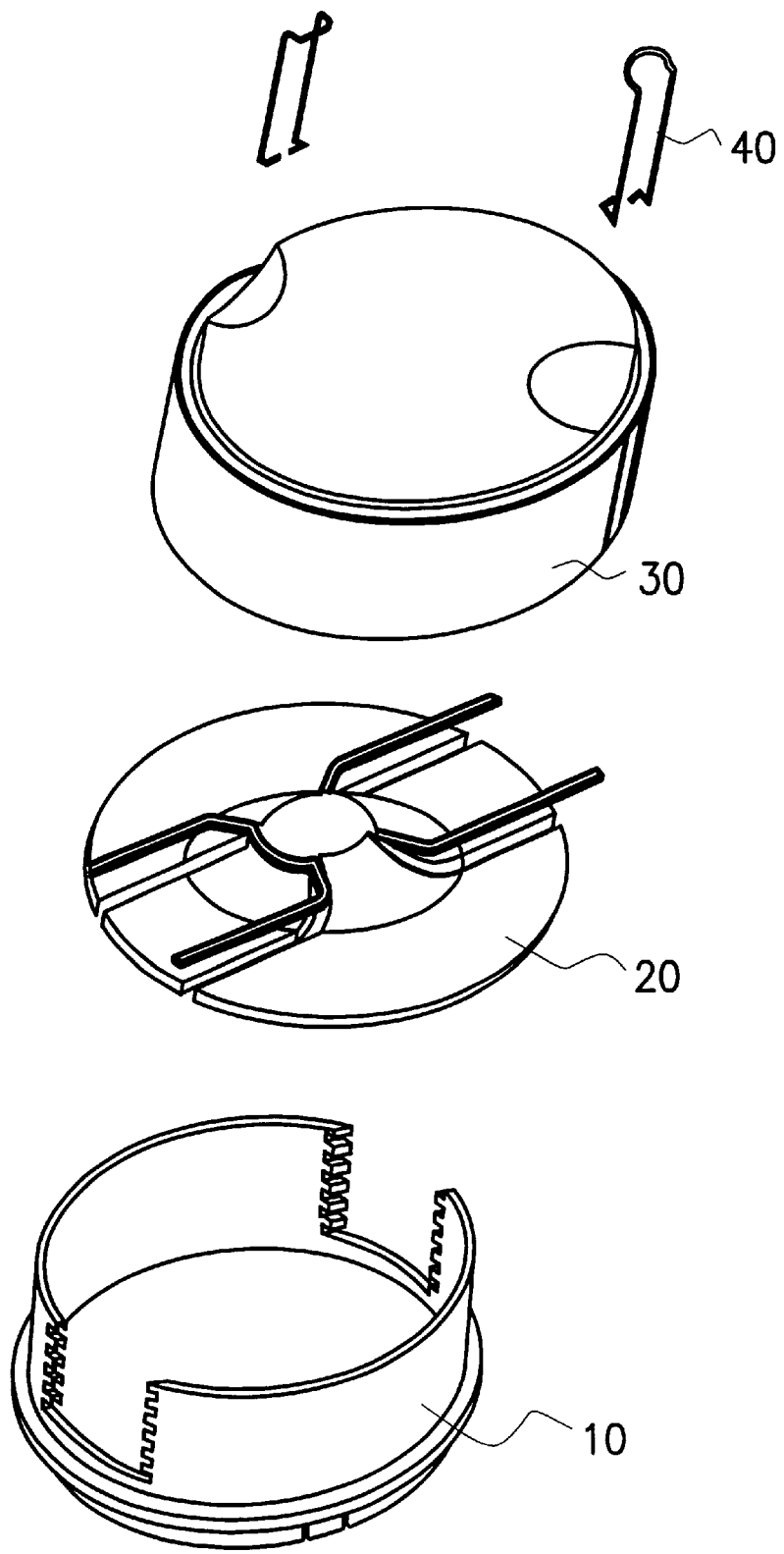
FIG. 1 is an exploded view of a wafer protective container according to the present invention.

FIG. 1 shows an exploded view of a wafer protective container according to the present invention, which generally comprises a container body 10, a locking device 20, a container cover 30, and a plurality of fasteners 40. The locking device 20 in this case is fixed on the container body 10 to ensure that IC wafers contained within the container body 10 are kept firmly in position, while the container body 10 is in turn covered by the container cover 30. The fasteners 40, which are mounted on the container body 10, will secure the container cover 30 to the container body 10 to complete the assemblage of a wafer protective container.

Figure 2A:
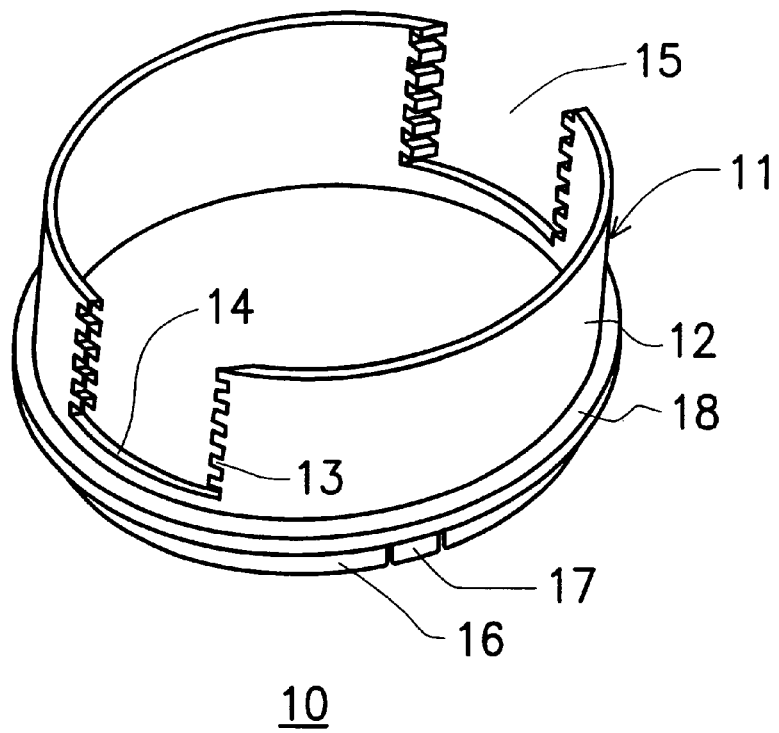
FIG. 2A and FIG. 2B are perspective views illustrating a top view and a bottom view of a container body according to one preferred embodiment of this invention.
Figure 2B:
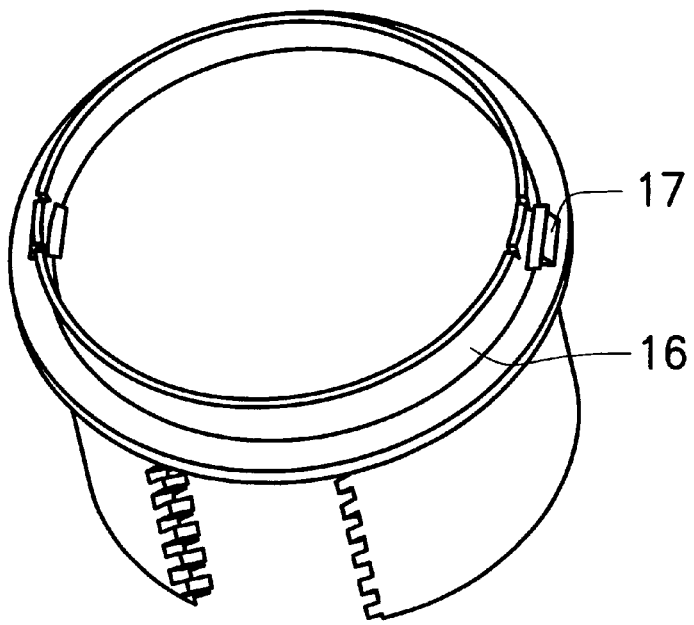

FIG. 2A and FIG. 2B are perspective views illustrating a top view and a bottom view of a container body according to one preferred embodiment of this invention. From the relevant diagrams mentioned above, it is understood that the container body 10 comprises a hollow cylinder 11, a circular plate 18, and a circular ring 16. The hollow cylinder 11 is made of a rim 14 having at least one wall segment 12 on a circular base 18, on which the IC wafers can be carried. At least one opening 15 exists in the wall segment 12 to allow easy loading and unloading of the IC wafers, and each edge of wall segment 12 delineating the opening 15 has a plurality of indentations 13 therein, as shown in FIG. 2A. Referring to FIG. 2B, the circular ring 16 is provided as a foot for the container, and further comprises a plurality of hook members 17. The openings 15 in this case allow the IC wafers to be picked up easily without inverting the whole wafer container. Thus, the risk of damaging the IC wafers is minimized.

Figure 3:
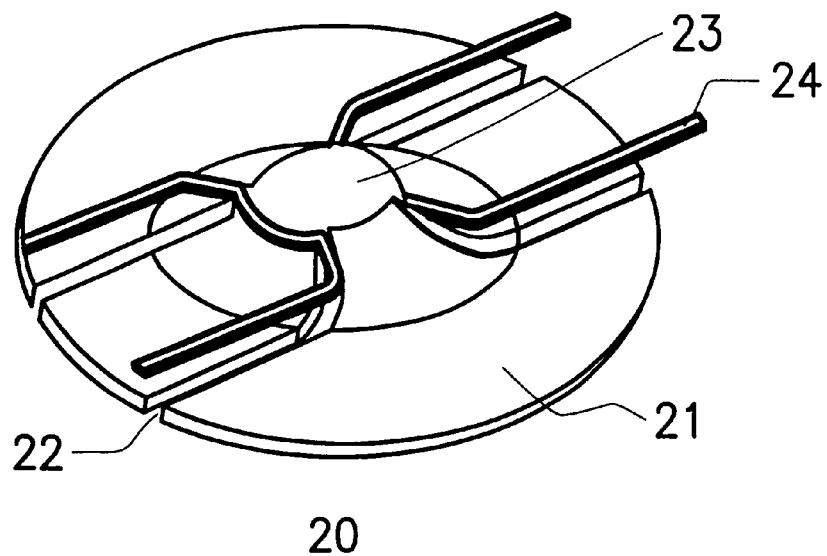
FIG. 3 is a perspective view of a locking device according to one preferred embodiment of this invention.

The locking device 20 is described in detail in the following with reference to FIG. 3. The locking device 20 is made integrally with an appearance that resembles an inverted dish, which is created by a circular protrusion 23 rising from an annular band 21, wherein the circular protrusion preferably resembles an inverted pan. The locking device 20 further comprises a plurality of projections 24 sticking out from the edge of the circular protuberance 23, and a plurality of corresponding grooves 22 in the annular band 21. The projections 24 can engage with the indentations 13 of the container body 10 during assemblage of the IC wafer protective container, so that the IC wafers that contained are within the container body 10 can be kept firmly in position. As a result, it is unlikely that the IC wafers inside the wafer protective container will move during transportation of the IC wafers from place to place, thus reducing the risk of damaging the IC wafers. In addition, usage of the locking device 20 reduces the amount of sponge used to prevent the movement of the IC wafer.

Figure 4:
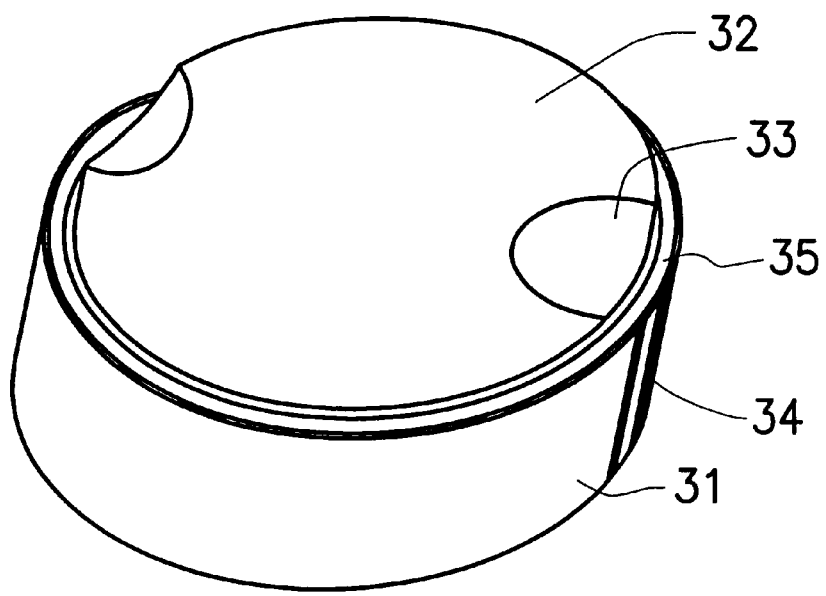
FIG. 4 is an enlarged view of a container cover according to one preferred embodiment of this invention.

FIG. 4 is a perspective view of a container cover according to one preferred embodiment of this invention. A container cover 30 is provided to cover the container body 10, wherein the container cover 30 comprises a circular protuberance 32 having a plurality of notches 33 thereon. The container cover 30 further comprises a cylindrical body 31 having a plurality of troughs 34 in its outer surface, and an annular hollow 35 between the circular protuberance 32 and a top edge of the cylindrical body 31. The notches 33 on the circular protuberance 32 allow easy opening or closing of the wafer protective container, while the notches 32 and the troughs 34 provide places for resting fasteners 40. The gripping of the IC wafer protective container is enhanced in this case by the annular hollow 35 between the circular protuberance 32 and the top edge of the cylindrical body 31. In such an arrangement, the circular ring of one container sits exactly in the annular hollow of another, whereby several wafer protective containers according to the present invention can be stacked one on top of the other.

Figure 5:
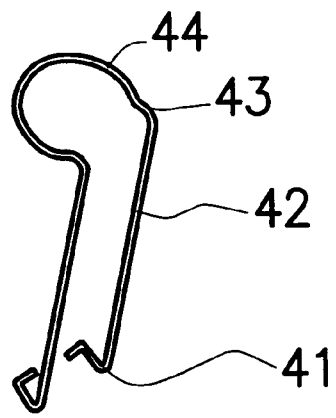
FIG. 5 is a perspective view of a fastener according to one preferred embodiment of this invention.

FIG. 5 is an enlarged view of a fastener according to one preferred embodiment of this invention. The fastener 40 generally comprises a plurality of connecting feet 41, a plurality of connecting bars 42 connected to the fastening feet, a plurality of connecting necks 43 connected to the connecting bars, and a semi-circular loop 44 linking the connecting necks 43. The fastener 40 in this case keeps the container body 10 and the container cover 30 securely fastened. Therefore, this eliminates the conventional step of sealing the wafer box with layers of masking tape to prevent the IC wafer box from accidentally opening. Thus, the IC wafers contained within the wafer protective container are free from contamination and damage.

Figure 6:
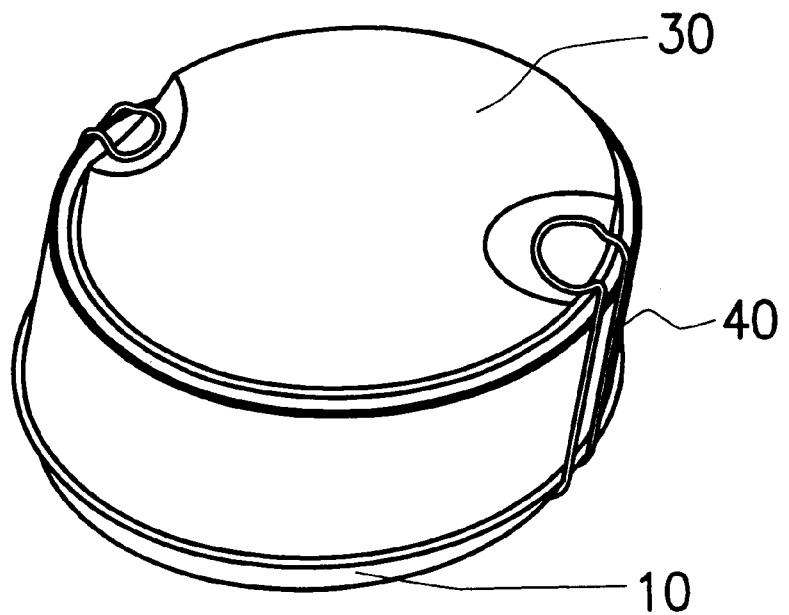
FIG. 6 is a perspective view of an IC wafer protective container after its assemblage.

A complete assemblage of the IC wafer protective container loaded with the IC wafers will be described in detail below. First of all, the container body 10 is provided and a required number of IC wafers is loaded therein. The loading process is facilitated by the openings 15. After enough IC wafers have been loaded into the container body 10, the locking device 20 is brought into contact with the container body 10, wherein contact is made by engaging the projections 24 with the indentations 13. The wafer protective container is closed by covering the container body 10 with the container cover 30. The container cover 30 is secured to the container body 10 by the fastener 40, wherein the fasteners 40 are fixed onto the container body 10 by mounting the fastening feet 41 of the fastener 40 on the hook members. The rest of the fastener 40 is pushed onto the container cover 30, so that the connecting bars 42 align with the corresponding troughs 34 on the cylindrical body 31, with the connecting necks 43 locking onto the top edge of the cylindrical body 31, and the semi-circular loop 44 resting on the notch 33. As a result, the assemblage of the wafer protective container is completed and its assembled structure is shown in FIG. 6.

Summarizing the above, the wafer protective container according to the present invention has the following advantages. The container body has a plurality of openings to allow easy handling for the IC wafers, while the locking device is used to maintain the IC wafers in position in the container body. Furthermore, the usage of the locking device reduces the amount of sponge used to prevent movement of the IC wafers. According to the present invention, the container cover covers the container body to provide double protection for the IC wafers, wherein the container cover has a plurality of notches to allow easy opening/closing of the wafer protective container. Since the fasteners secure the container cover to the container body, the wafer protective container cannot accidentally open during transportation, thus reducing the risk of contaminating and damaging the IC wafers.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wafer protective container for containing an integrated circuit wafer therein, comprising:

a container body for holding the integrated circuit wafer, the container body being made of a hollow cylinder, a circular base, and a circular ring, wherein the hollow cylinder consists of a rim having a plurality of integral wall segments with an opening between the wall segments, all of which are located on and above the circular base, and each wall segment has a plurality of indentations in an edge delineating the opening;

a locking device for keeping the integrated circuit wafer in position in the container body, further comprising an annular region, and a circular protrusion on the annular region, wherein a plurality of notches extend within the annular region and the circular protrusion, and a plurality of projections sticking out from the top of the circular protrusion, so that the projections correspond to the notches;

a container cover for covering the container body, further comprising a circular protuberance with a plurality of notches thereon, and a cylindrical body with a plurality of troughs in its outer surface; and a plurality of fasteners for securing the container cover to the container body, further comprising a plurality of connecting feet, a plurality of connecting bars, a plurality of connecting necks, and a semi-circular loop, wherein the connecting feet are connected to the connecting bars through the connecting necks, and the connecting necks are connected to the semi-circular loop.

2. The wafer protective container of claim 1, wherein the indentations of the container body engage with the projections of the locking device.

3. The wafer protective container of claim 2, wherein the projections of the locking device can engage with the indentations at any level of the container body, depending on how many integrated wafers are contained in the container body.

4. The wafer protective container of claim 1, wherein the projections of the locking device are parallel with each other.

5. The wafer protective container of claim 1, wherein the circular protrusion resembles an inverted pan.

6. The wafer protective container of claim 1, wherein the container cover further comprises an annular hollow between the circular protuberance and a top edge of the cylindrical body, so that several wafer protective containers can be stacked together.

7. The wafer protective container of claim 1, wherein the circular ring of the container body further comprises a plurality of hook members for mounting the connecting feet of the fasteners on the container body.

8. The wafer protective container of claim 1, wherein each of the fasteners is fixed on the container cover by pushing the connecting bars into the troughs in the cylindrical body, and locking the connecting necks on the top edge of the cylindrical body.

9. A circuit wafer protective container for containing integrated circuit wafers therein, comprising:

a container body, further comprising a hollow cylinder, a circular base, and a circular ring, wherein the hollow cylinder is located on and above the circular base, and the circular ring is located below the circular base;

a locking device, further comprising an annular region and a circular protrusion rising from the annular region, wherein a plurality of notches extend within the annular region and the circular protrusion, and a plurality of projections stick out from the top of the circular protrusion, so that the projections correspond to the notches;

a container cover, further comprising a circular protuberance with a plurality of notches thereon, a cylindrical body with a plurality of troughs in its outer surface, and an annular hollow between the circular protuberance and a top edge of the cylindrical body; and a plurality of fasteners, further comprising a plurality of connecting feet, a plurality of connecting bars, a plurality of connecting necks, and a semi-circular loop, wherein the connecting feet are connected to the connecting bars through the connecting necks, and the connecting necks are connected to the semi-circular loop.

10. The wafer protective container of claim 9, wherein the cylindrical body comprises a rim, a plurality of integral wall segments formed on the rim, with at least an opening between the wall segments so as to provide easy loading and unloading of the integrated circuit wafers.

11. The wafer protective container of claim 10, wherein the integral wall segments each have a plurality of indentations in an edge that delineates the opening.

12. The wafer protective container of claim 11, wherein the circular protrusion of the locking device has a plurality of projections to engage with the indentations, so that the integrated circuit wafers will be kept in position in the container body.

13. The wafer protective container of claim 9, wherein the circular protrusion of the locking device has a plurality of projections sticking out from its edge.

14. The wafer protective container of claim 9, wherein the circular ring of the container body further comprises a plurality of hook members for mounting the connecting feet of the fasteners.

15. The wafer protective container of claim 9, wherein each of the fasteners is fixed on the container cover by pushing the connecting bars into the troughs in the cylindrical body, and locking the connecting necks on the top edge of the cylindrical body.

* * * * *